United States Patent [19]

Krol

[11] 4,335,458
[45] Jun. 15, 1982

[54] MEMORY INCORPORATING ERROR DETECTION AND CORRECTION

[75] Inventor: Thijs Krol, Eindhoven, Netherlands

[73] Assignee: U.S. Philips Corporation, New York, N.Y.

[21] Appl. No.: 34,096

[22] Filed: Apr. 27, 1979

[30] Foreign Application Priority Data

May 2, 1978 [NL] Netherlands ........................ 7804674

[51] Int. Cl.³ .............................................. G06F 11/10
[52] U.S. Cl. ......................................... 371/38; 371/40
[58] Field of Search ............................... 371/38, 37, 40

[56] References Cited

U.S. PATENT DOCUMENTS

| | | | |
|---|---|---|---|
| 3,851,306 | 11/1974 | Patel | 371/38 |
| 3,893,070 | 7/1975 | Bossen et al. | 371/38 |
| 3,893,071 | 7/1975 | Bossen et al. | 371/38 |
| 4,072,853 | 2/1978 | Barlow et al. | 371/38 |
| 4,077,565 | 3/1978 | Nibby, Jr. et al. | 371/38 |
| 4,175,692 | 11/1979 | Watanabe | 371/38 |

*Primary Examiner*—Charles E. Atkinson
*Attorney, Agent, or Firm*—James J. Cannon, Jr.

[57] ABSTRACT

A memory in which each word location for a user word not only contains the bit locations for the actual data but also one parity bit for the parity over the entire word location and one correction bit. A fixed number of word locations are grouped to form a memory location for the storage of a memory word. When a word location is read by a data user, the parity bit indicates whether the word location contains none or one bit error. If the user word contains an error, the other word locations of the same memory location and also the associated correction bits are read to correct one arbitrary bit error in the memory word. In given cases, a plurality of bit errors can be corrected if they are situated in bit positions of the same rank within the word locations for the user words. The chance that a multiple error has exactly this configuration can be enhanced by a suitable arrangement of the bit locations in a memory. Thus, a limited amount of redundancy suffices in many cases. Memory words in different memory banks may have correction bits in common.

11 Claims, 6 Drawing Figures

Fig. 1

| 0 | 0 0 0 0 | $a^7$ | 1 0 1 1 | 0 | 0 0 0 0 | $a^7$ | 0 1 1 1 |
| $a^0$ | 0 0 0 1 | $a^8$ | 0 1 0 1 | $a^0$ | 0 0 0 1 | $a^8$ | 1 1 1 0 |
| $a^1$ | 0 0 1 0 | $a^9$ | 1 0 1 0 | $a^1$ | 0 0 1 0 | $a^9$ | 0 1 0 1 |
| $a^2$ | 0 1 0 0 | $a^{10}$ | 0 1 1 1 | $a^2$ | 0 1 0 0 | $a^{10}$ | 1 0 1 0 |
| $a^3$ | 1 0 0 0 | $a^{11}$ | 1 1 1 0 | $a^3$ | 1 0 0 0 | $a^{11}$ | 1 1 0 1 |
| $a^4$ | 0 0 1 1 | $a^{12}$ | 1 1 1 1 | $a^4$ | 1 0 0 1 | $a^{12}$ | 0 0 1 1 |
| $a^5$ | 0 1 1 0 | $a^{13}$ | 1 1 0 1 | $a^5$ | 1 0 1 1 | $a^{13}$ | 0 1 1 0 |
| $a^6$ | 1 1 0 0 | $a^{14}$ | 1 0 0 1 | $a^6$ | 1 1 1 1 | $a^{14}$ | 1 1 0 0 |
| | | $a^{15}$ | 0 0 0 1 | | | $a^{15}$ | 0 0 0 1 |

Fig. 5

$$
\begin{array}{cccccccccccccccc}
1 & 1 & 1 & . & . & 1 & 1 & 1 & 0 & 0 & 0 & . & . & 0 & 0 & 0 \\
0 & 0 & 0 & . & . & 0 & 0 & 0 & 1 & 1 & 1 & . & . & 1 & 1 & 1 \\
0 & 0 & 0 & . & . & 0 & 0 & 0 & 0 & 0 & 0 & . & . & 0 & 0 & 0 \\
0 & 0 & 0 & . & . & 0 & 0 & 0 & 0 & 0 & 0 & . & . & 0 & 0 & 0 \\
. & . & . & & & . & . & . & . & . & . & & & . & . & . \\
. & . & . & & & . & . & . & . & . & . & & & . & . & . \\
0 & 0 & 0 & . & . & 0 & 0 & 0 & 0 & 0 & 0 & . & . & 0 & 0 & 0 \\
0 & 0 & 0 & . & . & 0 & 0 & 0 & 0 & 0 & 0 & . & . & 0 & 0 & 0 \\
1 & a & a^2 & . & . & a^{k-2} & a^{k-1} & 0 & 1 & a & a^2 & . & . & a^{k-2} & a^{k-1} & 0 \\
\\
0 & 0 & 0 & . & . & 0 & 0 & 0 & 0 & 0 & . & . & 0 & 0 & 0 & 0 \\
0 & 0 & 0 & . & . & 0 & 0 & 0 & 0 & 0 & . & . & 0 & 0 & 0 & 0 \\
1 & 1 & 1 & . & . & 0 & 0 & 0 & 0 & 0 & . & . & 0 & 0 & 0 & 0 \\
0 & 0 & 0 & . & . & 0 & 0 & 0 & 0 & 0 & . & . & 0 & 0 & 0 & 0 \\
. & . & . & & & . & . & . & . & . & & & . & . & . & . \\
. & . & . & & & . & . & . & . & . & & & . & . & . & . \\
0 & 0 & 0 & . & . & 1 & 1 & 0 & 0 & 0 & . & . & 0 & 0 & 0 & 0 \\
0 & 0 & 0 & . & . & 0 & 0 & 1 & 1 & 1 & . & . & 1 & 1 & 1 & 0 \\
1 & a & a^2 & . & . & a^{k-1} & 0 & 1 & a & a^2 & . & . & a^{k-2} & a^{k-1} & 0 & 1 \\
\end{array}
$$

MEMORY INCORPORATING ERROR DETECTION AND CORRECTION

BACKGROUND OF THE INVENTION

1. Field of the Invention

The invention in general relates to the use of error correcting codes for binary data with respect to the coding of the data, the detection of errors occurring in the coded data, as well as (if possible) with respect to the correction of such errors. The standard work in this field is the book by Peterson and Weldon: Error Correcting Codes, MIT Press. For understanding the present invention, reference is made notably to chapters 2 and 6 thereof. In particular, the invention relates to a memory having a first memory bank with memory locations, each of which serves for storing one memory word therein and which include a sufficient number of bit locations for the storage of the data bits of a memory word and associated redundancy bits, so that for each memory word at least one detected error bit can be corrected, and furthermore having an input device with an address input, a data line for an addressed data word, and a corrector device which is connected to the data line in order to present, under the control of an incorrect data word read which is received therein, a corrected data word on an output of the corrector device.

2. Description of the Prior Art

Known memories are matrix-organized semiconductor memories, but the present invention is not restricted thereto or even to random access memories. A known error correcting code enables the correction of one error per memory word (SEC). Another known code is capable of correcting one error per memory word and of detecting two errors per memory word (SEC-DED). In accordance with the SEC system, a code word of n bits (data bits+detection/correction bits) should comprise at least $\log_2 (n+1)$ redundancy bits. This means that the number of redundant bits is comparatively large for a small word length. The invention has for its object to limit the percentage of redundant bits for each memory word. The invention aims to realise this object by means of user words of limited length, because a user word of long length cannot be processed in a processing device (cpu) and/or because a wide data path is expensive. A user word is a word accessible by means of a memory address available to the user of the data system. The objects in accordance with the invention are achieved in that the data line has connected to it a detector device for a data word read from the memory and a detection output of the detector device being connected to an activation input of the corrector device. Memory locations for the memory words are subdivided into a fixed number of word locations for user words, each location being separately addressable by a user address signal. Each user word comprises at least one bit location for a redundancy bit, with the result that at least one error bit in said user word can be detected by the detector device. A signal on said detector output is capable, in cooperation with said user address signal, of addressing the other word locations for user words of the same memory word, including their redundancy bits, in order to present the complete memory word thus addressed, including a predetermined number of correction bits added to the relevant memory word and also stored in the memory, to the corrector device in order to activate a correction.

As long as no error is detected, it is sufficient to read the desired, comparatively short user words of, for example, 8 or 16 bits. It is only when an error is detected that the comparatively long memory word is read for the correction of the error. If a user word contains for example, eight data bits, it should contain four correction bits in accordance with the said rule; thus, it has an added redundancy of 50%.

SUMMARY OF THE INVENTION

In accordance with a first embodiment of the invention, a memory word of $4\times 8$ data bits needs contain only four error detection bits plus six error correction bits, so an added redundancy of $10:32 = 31\%$. For a memory word comprising $8\times 8$ data bits, eight error detection bits and seven error correction bits suffice, so an added redundancy of $15:64 = 23\frac{1}{2}\%$. On the other hand, the possibility of correction/detection of errors in such a memory word may be greater; for example, detection/correction of two or even more errors. The length of the memory words and the possibility of correction/detection of errors in the complete memory word are subject to known compromises between the desired reliability of the memory system and the permissible cost and/or time loss inherent in correction/detection. In a simple embodiment in accordance with the invention, the correction of a single detected error can be realized in the same manner as if a non-subdivided memory word were concerned: the error detection bits of the other user words either do not provide further information, or the information that the remaining user words do not contain an error.

Preferably, a word location for a user word comprises one redundant bit position for the storage of a parity bit, the combined parity bits of a memory word forming a parity symbol. The user bits in corresponding bit positions of the user words form a user symbol, as many correction bits being added to the relevant memory word as this word contains user words in order to form a corrector symbol, all said symbols forming elements of the same Galois field. There is also provided first means for generating signals representing a parity matrix of the error correction code which consists of elements of the same Galois field. There is also provided second means for multiplying a read incorrect memory word by the parity matrix in order to generate an error symbol and a product symbol of error symbol and locator symbol. There is also provided third means for receiving the error symbol and the product symbol in order to generate an error locator, and fourth means for correcting the incorrect memory word by means of the error symbol and the error locator.

A construction of this kind offers several advantages. First of all, a modular construction is obtained, because exactly one correction bit is required for each user word. Furthermore, as a result of the cooperation of corrector symbol and parity symbol, a further redundancy reduction can be achieved. It has been found, for example, that for four user words comprising eight user bits each, only eight redundancy bits are required, which represents an added redundancy of $8:32 = 25\%$. Moreover, any arbitrary error in a user symbol can be corrected by means of the error symbol formed from the parity bits and the locator, because the latter is capable of assigning exactly one user symbol. This results in an error correcting capacity which, because interdependent errors can thus be treated together, is much greater than the previously described code which already resulted in a reduction of redundancy. The increased capacity of the code is thus embodied in two aspects:

a. more errors can be corrected
b. these are errors which usually occur together (as clusters).

In the case of M user words in a memory word, the error correcting code may be referred to as a correction on the basis of variables having $2^M$ possible values, in contrast with the known code which operates on the basis of binary variables. The execution of arithmetical operations on elements from a Galois field is a simple technique where the use of exclusive-OR gates besides normal logic gates (for example, of the NAND type), has a simplifying effect.

Preferably, said first means are suitable for generating signals representing a parity matrix having, for the K user symbols for each user word, including its parity symbol, a user block in the form of:

$$\begin{bmatrix} 1 & 1 & 1 & \ldots & 1 & 1 \\ m0 & m1 & m2 & \ldots & m(K-1) & 0 \end{bmatrix} \text{ with an additional } \begin{bmatrix} x \\ mj \end{bmatrix} \text{ column}$$

for the correction symbols, the element series $\{m0, m1, \ldots m(K-1), 0\}$ consisting, in the case of M user words per memory word, of all mutually different elements of the Galois field $GF(2^M)$, said column (1, 0) being assigned to the parity symbols and said column (x, mj) deviating from all other columns.

This results in a systematic construction of the parity matrix and hence of the complete device. Obviously, the rows of the parity matrix and, moreover within the user block also the columns, can be interchanged. Thus, the sequence of at the most $2^M$ elements of the Galois field $GF(2^m)$, including 0, is arbitrary.

Preferably, of the set of symbols $0, a^0, a^1 \ldots a(2^M-1)$ within the Galois field $GF(2^M)$, written as a power series, mj has the value $a^0$.

This preferred embodiment results in a simple implementation.

Preferably, said first means are suitable for representing a value $x=0$. Thus, the corrector bits are not taken into account in the parity determination. On the one hand, this may lead to an unsuccessful correction attempt if not only a user symbol is incorrect, but also a correction bit. On the other hand, this results in a comparatively simple circuit, as will be demonstrated hereinafter.

Preferably, said first means are suitable for representing a quantity $x=a^p$, said value being different from all elements of the series $\{m0, m1, \ldots m(K-1)\}$. Thus, the reliability is improved with respect to the already described embodiment, in that now the correction symbols are also taken into account for the determination of the parity.

Preferably, there is provided at least one second memory bank which has a construction similar to that of the first memory bank as regards the user symbols and parity symbols. For each second memory bank a memory word forms a code word with a corresponding memory word from the first memory bank, the correction symbol of the memory word from the first memory bank contained therein having a correcting effect for each code word. The required amount of redundancy of the corrector symbols is thus further reduced, because it is shared among a plurality of memory banks. Obviously, the number of second memory banks must be limited in view of the increased risk of two incorrect symbols occurring in a single code word.

Preferably, said first means are suitable for generating signals representing a parity matrix including as many (L) user blocks as there are memory banks, the user blocks containing (L−1) rows of elements 0, all one row, mutually differently situated, containing exclusively elements 1, and one correspondingly situated further row consisting of a series of all mutually different elements of the Galois field $GF(2^M)$, said additional column containing, at the area of said further row, a further element of the Galois field $GF(2^M)$ and containing for the remainder, in addition to at the most one element having the value $a^O$ within $GF(2^M)$, exclusively elements 0. The substantially modular construction of the priority matrix offers modular processing for multiplication by the parity matrix and hence the possibility of a simpler device.

Preferably, said first means are suitable for representing said further row of the parity matrix for each user block as mutually identical rows. This similarly results in a further simplification.

Preferably, there is provided a coding device for receiving, in the case of a write operation in a memory location which can be addressed by an address signal, the correction bits of this memory location which can also be addressed by said address signal, plus the modification information of the user word to be newly written in order to store also an updated set of correction bits on the basis of said combined information. Thus, the invention can also be advantageously used in a read/write memory. In the case of a write operation, it is merely necessary (if no error has occurred) to take into account the modification of the user word for the recalculation of the redundant bits.

Preferably, there are provided fifth means for generating user word modification signals under the control of a combination of an "old" and a "new" user word, sixth means for multiplying the user word modification signals by a vector $\{m0, m1, \ldots, m(K-1)\}$, in order to form a corrector modification intermediate symbol, seventh means for multiplying the corrector modification intermediate symbol by the user word number in order to form a corrector modification symbol, and eighth means for modifying the corrector symbol of the relevant memory word by the corrector modification symbol. The corrector symbols are thus systemetically updated.

Preferably, there are provided fifth means for generating user word modification signals under the control of a combination of an "old" and a "new" user word, sixth means for multiplying the user word modification signals by the vector $\{m0, m1, \ldots, m(K-1), mj\}$ in order to form a corrector modification intermediate symbol, seventh means for multiplying the corrector modification intermediate symbol by the user word number in order to form a corrector modification symbol, eighth means for modifying the corrector symbol of the relevant memory word by the corrector modification symbol, and ninth means for modifying the parity symbol of the relevant memory word annex corrector symbol by the corrector modification symbol. Thus, in addition to the corrector symbols, the parity symbols which are co-determined by the corrector symbols are also systematically corrected.

BRIEF DESCRIPTION OF THE DRAWINGS

The invention will be described in detail hereinafter with reference to the accompanying diagrammatic drawings, in combination with a specific code to be described.

DESCRIPTION OF THE PREFERRED EMBODIMENT

Hereinafter, the composition of a memory word, the use of the Galois field theory, a parity matrix, two systems of memory construction, the determination of the modification for a corrector symbol, and the permissible capacity limits will be successively described.

Figure 1:
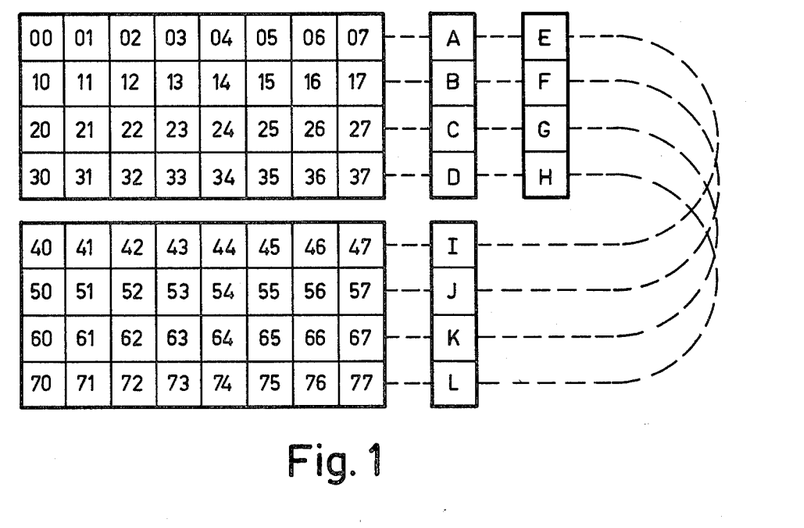
FIG. 1 shows an example of the composition of a memory word.

FIG. 1 shows an example of the configuration of a memory word. In a simple example, a memory word comprises 32 user bits (00-37) which are distributed over four user words of eight user bits each. In the figure, each user word is given on a separate line and is provided with a parity bit A-D which is stated on the same line. Furthermore, the relevant memory word has associated with it four correction bits E-H which are stated on the same four lines. For the time being, it is assumed that the four further lines are absent. The memory may be of conventional construction (for example, matrix-organized and operating according to RAM, ROM or EAROM principles). In the case of a read access by a data user, a user word appears on the output of the memory, for example, the bits 10, 11, 12, 13, 14, 15, 16, 17 and B. The bit B signals whether the parity of the bit series read is correct or incorrect. If the parity is correct, the user word becomes available to the user in unmodified form, together with the associated parity bit or not. If the parity is correct because two inversions of a bit have occurred on the same line, detection is not possible in this way. The risk of such a double error occurring on one line is small due to the limited number of bits on the same line and due to a storage such that the errors in the bits of such a line are mutually independent. This is generally the case if these bits are accommodated on separate integrated circuits (chips) or separate printed wiring board. The chance of the simultaneous occurrence of two errors is then equal to the product of the individual chances. The errors need not be independent on the same chip or printed wiring board. A complete unit can thus exclusively produce "0" signals in the case of a read operation (stuck at zero). The risk of an error is then ½ for random data storage. Such a unit, outside of which the errors always have to be mutually independent but inside of which the errors need not necessarily be mutually independent, is referred to as a "fault isolation area". Incorrect parity implies that an odd number (1, 3 . . . ) of bit inversions has occurred on the relevant line. The case of two or more inversions will meanwhile not be elaborated. When an error is detected, the entire memory word of four user words is read, i.e. also all bits 0-7, 20-27, 30-37 and the associated parity bits A, C, D. Moreover, the correction bits E, F, G, H associated with the relevant memory word are also read, so in total forty bits are read, eight of which are redundant. For a word comprising forty bits, six redundant bits are sufficient per se for the correction of a single error. Hereinafter, it will be demonstrated that in given cases a much larger number of errors can be corrected with the given redundancy, so that the redundancy used is not excessive. On the other hand, a number of four redundant bits would be required for correction of a single error for a single user word of 8 bits. With respect to the latter organization, the described system offers a reduction of redundancy. The bit locations of the same column, so for example 4, 14, 24, 34, then need not at all be independent as far as their error behavior is concerned. As a result, these four bit locations may be present, for example, in one and the same integrated circuit or on the same printed circuit board. The four user words with their associated redundant bits shown form a memory word. The memory may contain a large number of these memory words. Furthermore, it may be that the bits of a user word are not independent as regards their error behavior, because they are situated in the same fault isolation area, for example, two by two. In agreement with the foregoing, it is then still applicable that for each user word only a single error can be detected. Thus, this results in a higher risk of irreparable errors in the case of the already described "stuck at" situation.

FIG. 1 shows the "upper" four user words stored in a first member bank. FIG. 1 also shows for a second memory bank four further user words with user bits 40-47 . . . and so on, and associated parity bits I, J, K, L. For a read operation in these user words, the foregoing description is applicable as far as an errorless situation is concerned. In this more elaborate case, however, the memory consists of two memory banks, the errors being independent in the separate banks. The four correction bits E, F, G, H then relate to eight user words of 64 data bits in total. If an error occurs in one of these eight user words, all eight words must be read for the correction, including eight parity bits A-D, I-L and four correction bits E-H. For a larger number of banks, the same is applicable: the redundancy may then become comparatively smaller, but it appears that the correction requires more time or more equipment, because the same operations must be executed more often. The selection of the various parameters (number of user words for each memory word, number of simultaneously operational memory banks) is determined by the requirements imposed on the memory or the risk of an error. Finally, a relationship exists between the amount of redundancy which is at least required and the number of user bits for each memory word (inter alia dependent on the size of the fault isolation areas). This relationship will be discussed hereinafter.

As has already been stated, the content of the parity bits and correction bits provide information as regards the error to be corrected. It is alternatively possible for an error to be corrected under the exclusive control of the correction bits, the parity bits then serving only for the purpose of signalling. In that case known methods are used for the correction, but the realization of the detection is simplified by the smaller number of user bits for each user word. For the preferred embodiment, the information of the parity bits is also taken into account for the correction.

Figure 5:
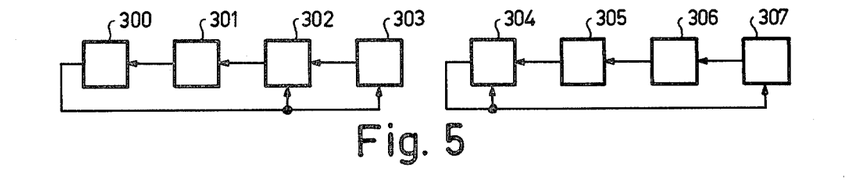
FIG. 5 illustrates the composition of a Galois field.

The further explanation of the invention is structured around the term "symbol". In the configuration shown in FIG. 1, a symbol consists of four bits of corresponding rank within four associated user words. For example, the sequence of the four bits 06, 16, 26, 36 indicates a symbol, and also that of the four bits 40, 50, 60, 70. The sequence is the same for all symbols. Each symbol may in this case have all values 0000-1111. Four-bit quantities of this kind may be considered as elements of a so-called Galois field. The notation of such a field is GF ($2^M$), where in this case M=4. For the elements of a Galois field, the four algebraic operations are defined and described, in an article by T. C. Bartee and D. I. Schneider, Computation with finite fields, Information and Control 6 (1963), pages 79-98. A major difference with respect to the real numbers exists in that a Galois field contains a finite number of elements, i.e. sixteen in the case GF ($2^4$). In this respect, FIG. 5 shows two different representations of the elements of GF ($2^4$): on the one hand as a power series of a (0, $a^0$ ... $a^{14}$) and on the other hand as a binary number in two ways in the two left and the two right columns, respectively. The generating of the binary representations will be explained on the basis of two circuits which operate as a counter. The left circuit operates on the basis of the so-called primitive and non-reducible polynomial $x^4+x+1$. Each stage 300-303 has the function of storing and transferring one bit. Furthermore, the stage 302, when activated, forms the modulo-2 sum of the data received from the stages 300 and 303. Activation of the stages, whereby the next position is reached, takes place by a common clock pulse signal not shown (stages 300, 301, 303 then operate as 1-bit shift registers). All 15 positions (not 0000) are thus cyclically formed (stage 300 contains the most significant bit). Similarly, the right half of the figure operates according to the primitive and non-reducible polynomial $x^4+x^3+1$; this results in a different representation. It is to be noted that in both cases the quantities $a^0$, $a^1$, $a^2$, $a^3$ are mutually linearly independent. The invention is not restricted to a given value of M; this value may be smaller as well as larger than 4. For trivalent logic, for example, use could be made of the Galois field GF ($3^4$). The primitive polynomials are different accordingly. Hereinafter, the abbreviated notation 0 and 1 is used for the elements 0 (bit wise 0000) and $a^0$ (bit wise 0001), respectively. It is to be noted again that the notation of the elements of the Galois field may also be different, without the relations between the relevant elements within said field being different, so that the Galois field itself is not modified thereby either.

Figure 2:
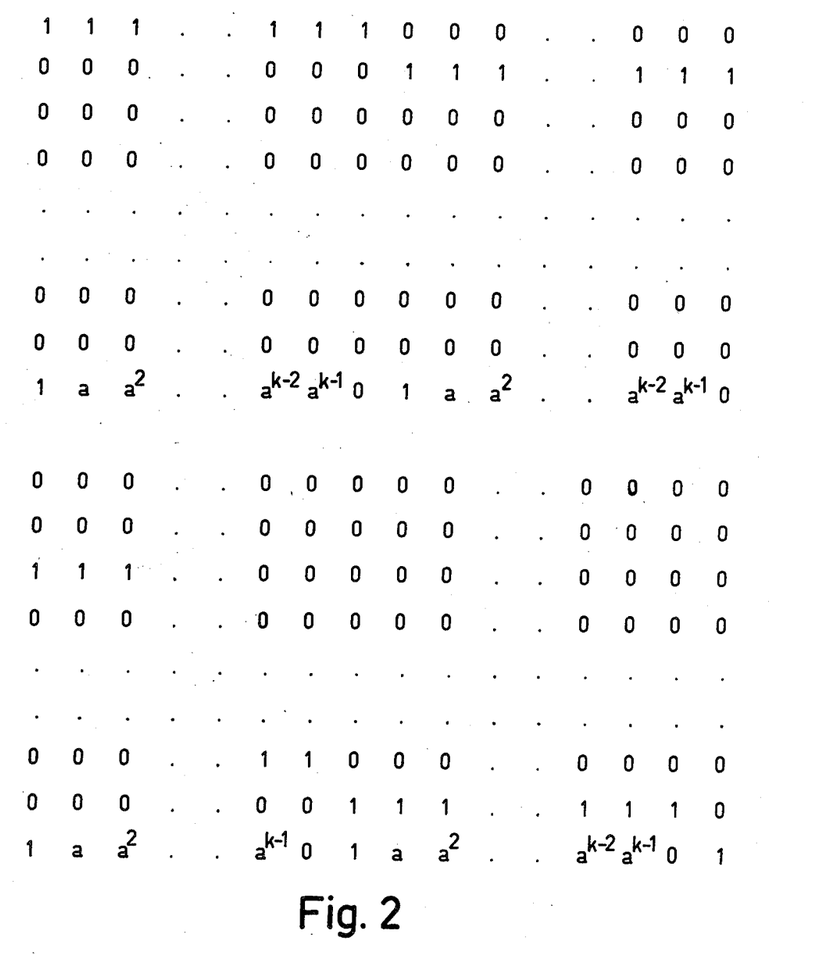
FIG. 2 shows a parity matrix.

FIG. 2 shows an example of a parity matrix [H] for the proposed code. Each error correcting code may be fully described by a matrix of this kind, because the following is valid for all code words $\vec{c}:\vec{c}.[H]=0$; thus, the code words are orthogonally arranged with respect to the parity matrix. The matrix consists of sub-matrices or "blocks" having a width of (K+1) columns, K being the number of user bits in a user word without the redundancy. In the example of FIG. 2, therefore K=8. The number of matrix blocks L corresponds to the number of memory banks (equal to 2 in the FIG. 1). The elements of the matrix are elements of the Galois field GF ($2^4$). The first row of the first block contains the elements "1", bit-wise written as (0001) in accordance with the foregoing, the second row of the second block contains the elements "1", etc. The next to last row of the last block contains the elements 1. The number of rows exceeds the number of banks of the memory by one and thus amounts to three in this example. The last row of all blocks contains the same elements 1, a, $a^2$, .. . $a^{K-1}$, 0 in this example. In another example, this series may also be q0, q1, ... q(K-1), 0, subject to the condition that $qi \neq qj$ for $0 \leq i,j \leq K-1$ and $i \neq j$ and, moreover, qi is an element of GF ($2^M$) as described above. It is even permissible for each block of the matrix to have its own specific sequence q0, q1 ... q(K-1), 0, even though this will on the other hand lead to a more complex device. The foregoing notably indicates that such a "user block" need not contain all different elements of the relevant Galois field, because the length of the user words is too small for this purpose. In addition to said blocks the matrix also comprises a "very last" column with the elements (0, 0, ... 0, 1). An alternative consists in that the very last column of the parity matrix is (0, 0, ... 0, 1, 1), in which case two elements "1" are present: one on the last row, and one on an arbitrary other row. The series (1, a, $a^2$ ... $a^{K-1}$, 0) can thus be replaced by another series. The implication of the choice for the "very last" column will be explained hereinafter. The parity matrix thus comprises the columns 0, 1, ... {L(K+1)+1}, and the rows 0, 1, ... L. The sequence numbers of the columns are given by {d(K+1)+b)}, in which d is the bank (block) number and b is the sequence number within a bank. The different banks are thus given by d, $0 \leq d \leq L-1$, and the columns within a bank are given by b, $0 \leq b \leq K$. The very last column is given by d=L and b=0. The example of FIG. 1 thus results in a matrix of 19 columns and three rows. However, FIG. 2 also shows the shape of such a matrix for more rows and columns. The upper half of this Figure shows the first and the second block, while the lower half shows the beginning of the third block, the end of the next to last block, the last block and the "very last" column. Hereinafter, the rows of the parity matrix may be interchanged. The effect thereof consists in that the sequence of the elements of the syndrome vector to be described hereinafter is modified. On the other hand, the columns within a user block may be changed. This results in the different sequence of the elements $a^0$, $a^1$ ... $a^{K-1}$, 0 described above. Finally, the user blocks may be interchanged. This has the same effect as the interchanging of the rows. The displacement of the "very last" column only implies a different physical location of the correction bits. The parity matrix [H] can now generally be written as:

$$[H]=[L_{d(K+1)+b, i}]$$

where $0 \leq d \leq L$, $0 \leq b \leq K$, $0 \leq i \leq L$. Similarly, the transposed matrix thereof can be written as:

$$[H^T]=[h_{i, d(K+1)+b}]$$

The code words may then be considered to contain L(K+1)+1 elements (i.e. 19 in accordance with FIG. 1) or symbols, each symbol being an element of GF ($2^4$).

A code word thus contains the corresponding memory words from the various memory banks. The symbols are numbered in accordance with the same system as the columns of the parity matrix. Assume that one element having the index f deviates from the correct value, which may be represented as:

$$\vec{c}^* = \vec{c} \oplus \vec{e}_f$$

Therein, the vector $\vec{c}$ represents the correct code word, $\vec{c}^*$ the incorrect code word, and $\vec{e}_f$ a vector which in this example also comprises 19 elements, 18 of which have the value 0 (so they also are written as 0000, see FIG. 5), only the element with the index f having the form of the symbol $e_f$ which is not identically equal to zero. The value of this symbol is known per se from the four parity bits of the relevant memory word, where it has the value (1111), if all bits of the incorrect symbol are also incorrect themselves. The exclusive-OR symbol ⊕ indicates that the elements (symbols) of c and $e_f$ are bit-wise and modulo-2 added. Furthermore, the syndrome of the error can be determined in known manner by multiplication by the parity matrix (always known beforehand):

$$\vec{s} = \vec{c}^*[H] = (\vec{c} \oplus \vec{e}_f) \cdot [H] = \vec{e}_f[H]$$

The syndrome vector s is independent of the data of the correct code word $\vec{c}$ because, as already stated, $\vec{c} \cdot [H]$ is always equal to zero and because, furthermore exclusively linear operations are used. The syndrome vector $\vec{s}$ consists of (L+1) elements, so three elements (symbols) of four bits in the example of FIG. 1. The first L elements (in this case two) of the syndrome vector $\vec{s}$ will all except one be identical to zero (0000) in the case of such an error. In that case, the one has exactly the value of $e_f$ and thus forms one of the two data required for the error correction: the error symbol. Which one of these elements is not equal to zero is determined by the bank number in the memory in which the error has been detected, which thus determines the value of d in the formula:

$$f = d(K+1) + b.$$

Therein, f is the location of the error, and d and b are the bank number and the location within the bank, respectively. For the determination of f, the value of b must also be known. The value of the last element (the third element in the example of FIG. 1) of the syndrome vector $\vec{s}$ is given by $\vec{e}_f g_f$. Therein, $\vec{e}_f$ is again the error vector, comprising 18 elements (0000) and one element which is not identical to zero but has the value $e_f$ (symbol). Furthermore, $g_f$ is the element of the bottom row (in the example the third row) and the column having the rank f of the parity matrix. From these data $e_g$ and $e_f g_f$, $g_g$ can be determined in known manner so that the value of b in the formula shown is known. Thus $g_f$ can be determined in different ways, for example, by the addressing of a read only memory. In the example shown in FIG. 1, $e_g$ and $e_f g_f$ may each have sixteen different values, so that a memory capacity of $16^2 = 256$ words suffices. The word locations store the value of b which thus ranges from zero (0000) to 8 (1000).

An additional word information can be reserved for a multiple error, so that a word length of four bits is required. Another method, particularly suitable for the configuration shown in FIG. 2, consists in that $e_f$ is repeatedly multiplied by $a^1$, until it equals $e_f g_f$, the number of multiplications indicating the rank of the error position. Obviously it may be that $e_f g_f$ immediately equals $e_f$, so that none of said multiplication operations are required. When an error is detected, therefore, first the incorrect code word is multiplied by the suitably stored parity matrix by means of known matrix multiplication techniques. From this syndrome vector $\vec{s}$, the following items are determined: the value of d (in this case 0 or 1), the error symbol $e_f$, and the product symbol of error symbol $e_f$ and locator symbol $g_f$, the combination of error symbol and product symbol together producing the error locator b and hence the error vector $\vec{e}_f$. The parity matrix may be stored in a part of a control memory which is constructed as a read-only member.

The foregoing is also subject to a relation (to be satisfied) between the number of user words for each memory word and the number of bits for each user word. This relation will be described hereinafter. If this relation is satisfied, an arbitrary error vector $\vec{e}_f$, causing a one-bit error in a user word (including the parity bit thereof), can be detected with 100% certainty. The "very last" column of the parity matrix then had the form 0, ... 0, 1. An error in a corrector bit (E, F, G, H in FIG. 1), however, is not detected. The entire memory should then be periodically read to check the correct value of the corrector bits. If this is omitted, an error which has occurred can be incorrectly corrected again by a correction bit which itself is incorrect. A solution to this problem will be discussed hereinafter. If only one memory bank is present in the foregoing example, the syndrome vector $\vec{s}$ has only two elements.

Figure 3:
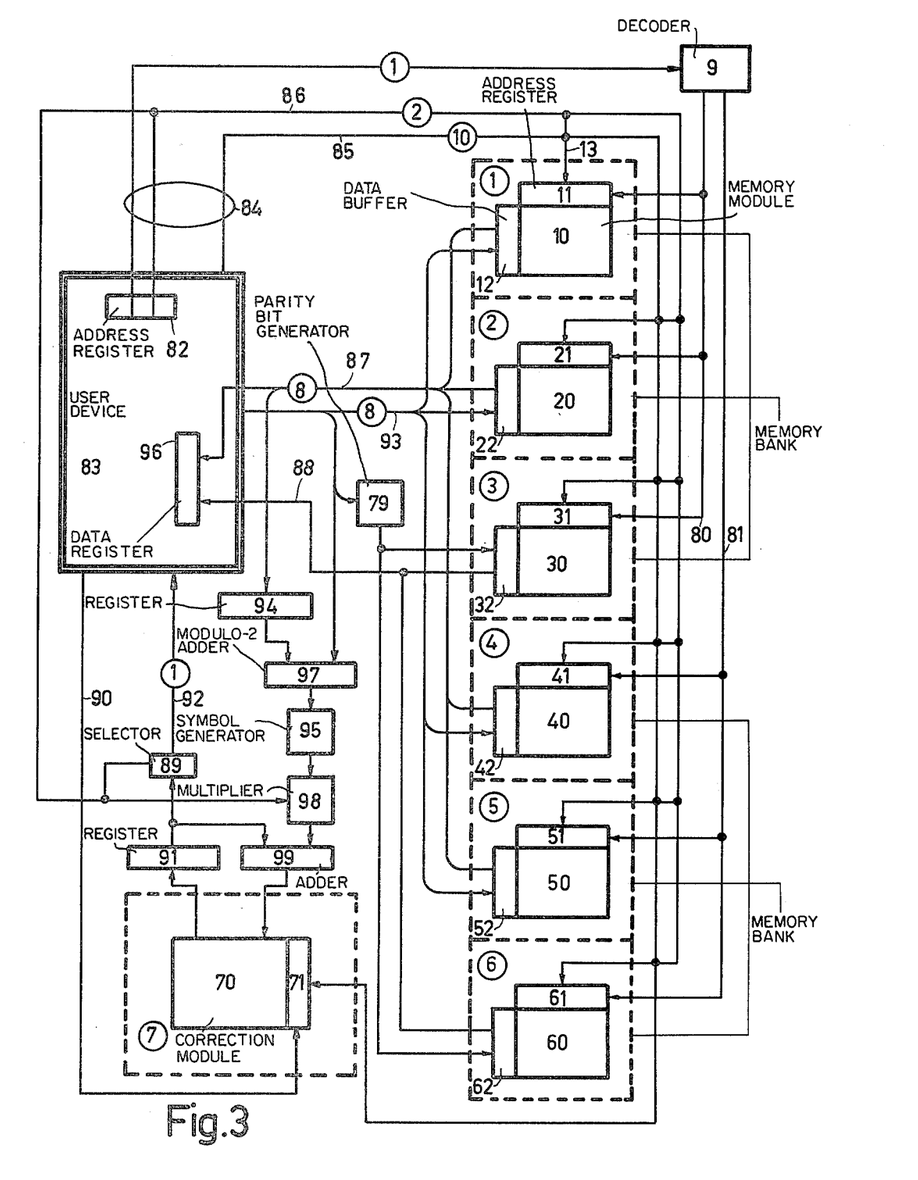
FIG. 3 shows a part of a memory device.

FIG. 3 shows a memory comprising two banks, a correction possibility for one error symbol for each memory word without detection of errors in the correction symbols. The banks comprise the modules 1–3 and 4–6, respectively. Each data bit (user bit), and also the parity bit of a user word, is stored on a separate module, for example, an integrated memory chip. The figure shows only a selection therefrom for the sake of simplicity. The module 1 contains the first data bit of the first user word (00 in FIG. 1) in the memory matrix 10 with the address register 11 and the data buffer 12. This module is of a conventional type. For the remainder, said address register and data buffer are not strictly necessary. A single data bit in the memory matrix can be addressed by an address received on the address line 13. The module 2 furthermore contains the last data bit of the first user word (07 in FIG. 1) in the matrix 20 with the address register 21 and the data buffer 22. The intermediate modules have been omitted for the sake of brevity. The module 3 contains the parity bit of the first user word (A in FIG. 1) in the memory matrix 30 with the address register 31 and the data buffer 32. The other user words of the same memory word can be stored in the described modules in the same manner as the first user word, and this is also applicable to other memory words. The modules 1 ( . . . ) 2, 3 of the first memory bank are selected together by the line 80 from the decoder 9. A logic "1" thereon may have the function of an enable signal. Similarly, the module 4 contains the first data bit of the first user word in the second memory bank (40 in FIG. 1); the module 5 contains the last data bit of this user word and the module 6 contains the associated parity bit. The other modules of the second memory bank are also omitted. The modules 4 ( . . . ) 5, 6 and the other modules of the second memory bank are selected together by a signal on the line 81 from the decoder 9, which thus generates a one-out-of-two code. All relevant modules may be of similar construction. When use is made of modules having a capacity of 4 kilobits (4096 words of 1 bit) and an organisation as shown in FIG. 1, the memory contains 8192 user words of 8 user bits each plus one parity bit, which are distributed over 2048 memory words. The module 7 each time contains the data of all correction bits (E, F, G, H in FIG. 1) for each memory word and thus has a capacity of 1024 words of four bits each. Obviously, the module 7 may be constructed from four similar elements, each of which has a capacity of 1024 words of 1 bit each. For a larger capacity, the memory configuration may be extended accordingly.

If the user device 83 demands memory access, it dispatches an address, via the line 84, to the memory which consists of a bank address (one bit in this example) to the decoder 9, a memory location address (in this example 10 bits) on the line 85, and a user word number (inside the memory word), in this example two bits on the line 86. The user word read appears on the line 87 in the form of 8 bits in parallel, and the associated parity bit appears on the line 88. The lines 87 and 88 from corresponding modules of the different banks are bit-wise combined, for example, in a wired-OR function. The user device 83 may be of conventional construction, for example, a central computer from the Philips P 1000 series. In the user device 83, the parity of the nine bits is determined in a customary manner, for example, by means of exclusive-OR logic. The user device furthermore comprises a data register 96 in which the user word received is temporarily stored. If the parity is correct, the user word becomes available for further processing. If the parity is incorrect, the information of the bank number and user word number is cyclically recorded, for example, in that the address register 82 concerning these three bits is constructed as a counter which continues to count in successive clock pulse cycles. The eight (in this example) user words received are all temporarily stored in registers which are connected to the register 96, which registers are not shown for the sake of simplicity. The two bits on the line 86 are applied to the selector 89. As long as no error is detected, this has no consequences, because any data appearing on the line 92 are ignored by the user device.

The ten-bit memory word address is applied to the module 7 as an address signal. When an error is detected, the user device 83 applies an enable signal to the module 7 via the line 90, with the result that the four correction bits assigned to the relevant memory word are addressed. These correction bits are temporarily stored in the register 91. Meanwhile, the selector 89 receives the cyclically circulating word number data and transports under the control thereof, one of the four correction bits from the register 91, via the line 92, to the user device 83 which successively receives all 76 bits from the arrangement shown in FIG. 1. Correction then takes place, on the basis of the foregoing description, in the following steps:

(a) First of all, the code word to be corrected is multiplied by the parity matrix in order to generate the syndrome $\vec{s}$. The parity matrix is stored, for example, in a part of a read-only memory of the user device 83 and has the following form:

$$H = \begin{vmatrix} 1 & 1 & 1 & 1 & 1 & 1 & 1 & 1 & 1 & 0 & 0 & 0 & 0 & 0 & 0 & 0 & 0 \\ 0 & 0 & 0 & 0 & 0 & 0 & 0 & 0 & 0 & 1 & 1 & 1 & 1 & 1 & 1 & 1 & 1 & 0 \\ 1 & a & a^2 & a^3 & a^4 & a^5 & a^6 & a^7 & 0 & 1 & a & a^2 & a^3 & a^4 & a^5 & a^6 & a^7 & 0 & 1 \end{vmatrix}$$

The multiplication produces the syndrome vector. Matrix multiplication is a conventional technique used in digital data processing and will not be elaborated for the sake of brevity.

(b) Subsequently, the values of the three elements $\underline{s0}$, $\underline{s1}$, $\underline{sr}$ of the syndrome vector are determined, for which the following possibilities occur:

| | s0 | s1 | sr | |
|---|---|---|---|---|
| (1) | 0 | 0 | 0 | no data concerning an error (= correct) |
| (2) | ≠0 | 0 | 0 | error in parity module of bank 0 |
| (3) | 0 | ≠0 | 0 | error in parity module of bank 1 |
| (4) | 0 | 0 | ≠0 | error in correction module (70) |
| (5) | ≠0 | 0 | ≠0 | error in user symbol bank 0 |
| (6) | 0 | ≠0 | ≠0 | error in user symbol bank 1 |
| (7) | ≠0 | ≠0 | =0 | multiple and incorrectable error. |
| (8) | ≠0 | ≠0 | ≠0 | |

The case (1) indicates that no error is present and can, therefore, be encountered as the result of an additional check. The cases 2, 3, 4 indicate that the error has not occurred in a user symbol and that the addressed user word is suitable for use without correction. The cases 5 and 6 indicate that the user word is to be corrected. For example, if originally a user word from bank 0 had been addressed, in principle the case 3, 4 or 6 cannot occur; also the case (4) can only be encountered during a checking operation. It is only necessary to correct the user word each time in the cases (5) and (6). The location of the error is indicated by the vector division $\underline{sr:s}$ $(1, 0) = a^i$. This division is defined by the algebra of the Galois fields.

(c) If the value of i is known and the user device requires only the originally addressed user word, it is merely necessary to invert the bit corresponding to the rank i (because an error bit was detected in this word). If the entire memory word is to be used, the symbol $\underline{e_f}$ found must be bit-wise and modulo-2 added to the relevant user symbol.

The result of the above correction consists on the one hand of a corrected user word, and on the other hand of a correction word which can be stored, for example, as seven data 0 and one data 1 in a location determined by the said quantity i. This correction word, having the same structure as a user word, is stored (including the bank number of the bank in which the error occurred). Moreover, it is recorded, by suitable statistical steps, how often a given correction word has occurred. When a given sum is reached, it may be assumed with certainty that a given module produces the error, so that the correction word may obtain the status of predetermined corrector to be used for directly correcting an error detected in a user word. Obviously, this saves the time which would otherwise be required for reading the other user words and for determining the already described syndrome vector.

On the other hand, if a new user word is to be written in FIG. 3, the line 83 again receives a thirteen-bit address, consisting of a bank number, memory word address and user word number, from the user device. The read/write control of the memory is not separately shown. During a first processing operation, the user word stored in the relevant user word location is read, checked for an error and, if necessary, corrected in the described manner, and stored, possibly after correction, in the eight-bit register 94. Besides the input shown, this register may also (or even exclusively) comprise an input which is connected to an output of the register 96 in the user device 83 in order to receive therefrom the corrected user word read. The latter connection is not shown for the sake of brevity. Moreover, even if no error is detected in the user word read, the four corrections bits of the relevant word are read from the module 70 and are stored in the register 91 under the control of an enable signal on the line 90. Subsequently, the data of the user word to be newly written are transported, via the multiple line 93, to the relevant modules and, moreover, to the parity bit generator 79 which generates a parity bit on the basis of the user bits received; this can again be realized in a conventional manner by means of exclusive-OR logic. The parity bit is stored, together with the user bits, in the relevant module 3 or 6 which is also addressed (by way of the line 84). At the same time, the "new" data are applied, together with the "old" data still present in the register 94, to the bit-wise operating modulo-2 adder 97. The result (8 bits) is applied to the symbol generator 95 and is converted therein into a four-bit symbol as will be described in detail hereinafter with reference to FIG. 4. This conversion is effected in that the user word (W0 . . . W7) is multiplied by a matrix which is composed of the quantities (a$^0$ . . . a$^7$). The result is a four-bit symbol from GF (2$^M$). In the multiplier 98, this symbol is multiplied by a further four-bit symbol (a$^j$), the value of the exponent j being determined by the user word number inside the memory word which is applied to the multiplier 98 via the line 86 and wherefrom the modification for the corrector bits follows. In the element 98, this modification is bit-wise and modulo-two added to the content of the register 91; the final result is then stored (again) in in the module 70 the addressing still being provided by the signal on the line 85. Read/write control is again not separately shown with respect to the module 70.

Hereinafter, a description will be given of a further embodiment in which the correction bits are also checked. The following parity matrix is used, the simple example of FIG. 1 again being applicable:

$$H = \begin{bmatrix} 1 & 1 & 1 & 1 & 1 & 1 & 1 & 1 & 1 & 0 & 0 & 0 & 0 & 0 & 0 & 0 & 0 & 0 \\ 0 & 0 & 0 & 0 & 0 & 0 & 0 & 0 & 0 & 1 & 1 & 1 & 1 & 1 & 1 & 1 & 1 & 1 \\ a & a^2 & a^3 & a^4 & a^5 & a^6 & a^7 & a^8 & 0 & a & a^2 & a^3 & a^4 & a^5 & a^6 & a^7 & a^8 & 0 & 1 \end{bmatrix}$$

Notably the element a$^0$ no longer occurs in the user blocks in the last row, because the elements have been multiplied by a. Furthermore, the nineteenth column contains the element 1 on the second line (obviously, this may alternatively be the first line), with the result that the correction bits form part of the memory bank 1. As has already been stated, instead of the power series {a . . . a$^8$}, a different series of the elements of GF (2$^M$) may be used; this is also applicable to the second "1" in the very last column (0 1 1) which actually represents the symbol a$^0$, for which another exponent which is unique within the associated user block may also appear. The error detection procedure is initially the same, but the three elements (s0, s1, sr) of the syndrome vector s now have the following meaning:

| | s0 | s1 | s3 | |
|---|---|---|---|---|
| (1) | 0 | 0 | 0 | no information concerning an error |
| (2) | ≠0 | 0 | 0 | error in parity module of bank 0 |
| (3) | 0 | ≠0 | 0 | error in parity module of bank 1 |
| (4) | ≠0 | 0 | ≠0 | error in user module of bank 0 |
| (5) | 0 | ≠0 | ≠0 | error in user module of bank 1 or error in correction module |
| (6) | 0 | 0 | ≠0 | |
| (7) | ≠0 | ≠0 | ≠0 | multiple and incorrectable error |
| (8) | ≠0 | ≠0 | ≠0 | |

Figure 6:
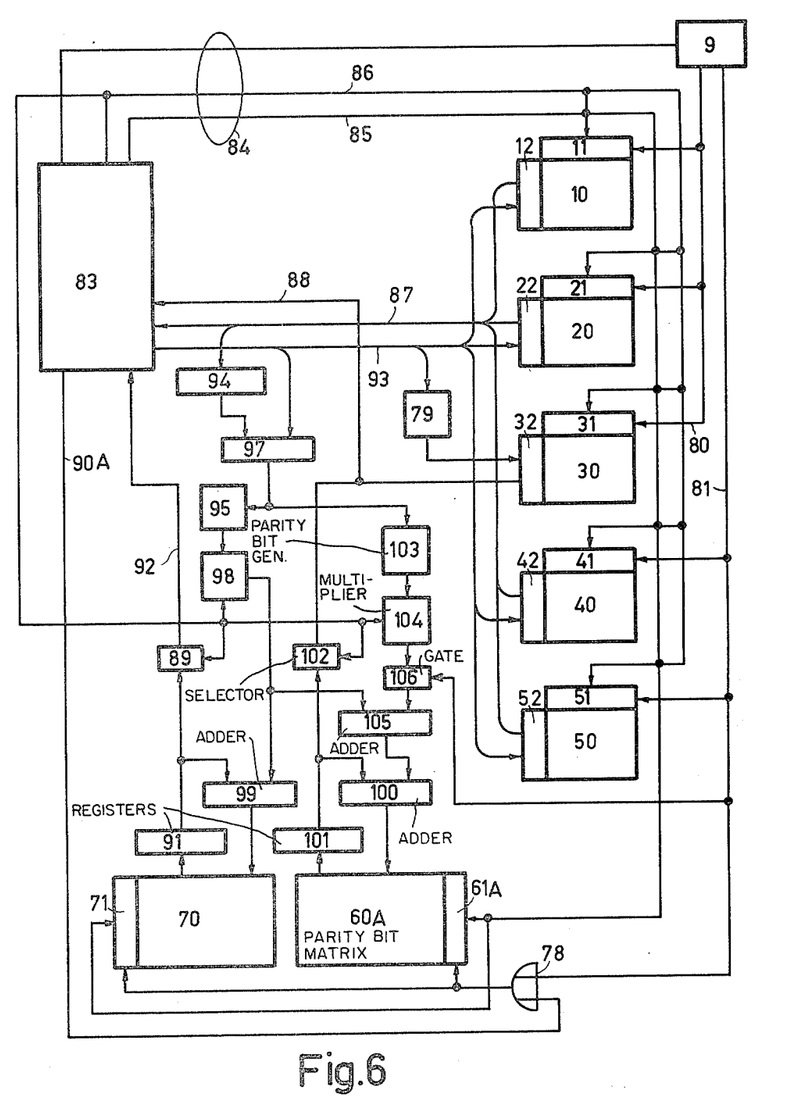
FIG. 6 shows a further embodiment which is an elaboration of the circuit shown in FIG. 3.

The same considerations and operations as described for the previous embodiment are applicable. A difference consists in that the case 6 does not separately signal an error in the correction module. The modified signalling system, obviously, has consequences for the device shown in FIG. 3, and a device elaborated for this purpose is shown in FIG. 6. In this embodiment, the parity bits of the bank 0 (matrix 30) are determined on the basis of the data content of the relevant user words, but for the bank 1 the corrector bits are co-decisive for the value of the parity bit (this is the "1" in the second row and the nineteenth column of the above table). The corrector bits themselves are not co-determined by the value of the parity bits. Therefore, the output of the parity bit generator 79 in FIG. 6 is connected only to the module 3 (matrix 30) of the bank 0. Furthermore, the series connection of the elements 94, 97, 95, 98, 99 and that of the elements 91, 89 in FIG. 6 correspond to FIG. 3. The parity bits in the bank 1, however, are now treated as follows:

When a new user word is to be stored, the bit-wise exclusive-OR function of the user bits of "old" and "new" user word is again formed in the element 97. As has already been described, any modified correction bits of the relevant memory word are stored in the module 70 by way of the series connection of the elements 95, 98 and 99. Instead of the module 6, there is provided a matrix 60A with an address register 61A for the storage of the parity bits of the bank 1. This matrix has the same capacity as the said matrix 60, but it does not have the described configuration of 4096 words of 1 bit, but the same configuration as the matrix 70, so for example, 1024 words of 4 bits. These can be addressed for each word by the ten address bits on the line 85. In the case of a read operation in the bank 1, the relevant four parity bits are read, under the control of an enable signal on the line 81, from the matrix 60A and also the four correction bits from the matrix 70. These eight bits are temporarily stored in the similarly constructed registers 91, 101. The function of the line 90 as regards the matrix 70 is now performed by the line 81. The selectors 89 and 102 receive the two address bits on the line 86 and allow the passage of only one parity bit via the line 88, and one correction bit, via the line 92, to the user device 83 in the case of a normal read operation. This device 83 determines in the described manner, the parity of the 8-bit word (bank 0) read or the 9-bit word (bank 1) read. If the parity is correct, the data become available for further processing. In the case of a read operation in the bank 0, use is made of the same circuit for calculating the parity, a dummy correction bit being simulated which does not influence the parity. If the parity is incorrect, the 76 bits of the memory word are read again by way of cyclical modification of the address on the line 80, 81, 86 and the correction is performed in the described manner (taking into account the modified parity matrix).

When a new user word is stored, the matrices 70 and 60A are always read first in that a signal in this sense on the line 90A of the user device is combined with the signal on the line 81 in the OR-gate 78. The correction bits read are applied to the element 99. The element 103 receives the bit-wise modulo-2 sum of the old and the new user word (8 bits) from the element 97 and forms therefrom one parity bit in the same manner as the element 79 (the latter is effective only if the new user word finds room in module 0). The parity bit of the element 103 is multiplied by the quantity a$^j$ in the element 104. The exponent j has the same value as the user word number within the memory word (i.e. 0 . . . 3) and the quantity $a^j$ is thus given in FIG. 2. As has already been stated, all quantities $a^j$ ($0 \leq j \leq 3$) are linearly independent from each other. The value of j is applied as the two-bit signal (00, 01, 10, 11) on the line 86. The two address bits are decoded to form a four-bit symbol. If the parity bit is "0", the result of the multiplication obviously is "0000". The gate 106 is controlled by the line 81 and is blocked when the new user word is intended for the bank 0; obviously, the element 105 then receives "0000". The module 105 is a four-bit modulo-2 adder and receives, from the element 98, the 4-bit modification vector for the correction bits to be introduced and added to the four-bit modification vector for the parity of the user bits as determined in the element 104. This results in the total modification vector to be introduced for the parity bits. The element 100 is a four-bit modulo-2 adder and adds the said modification to the parity bits of the register 101, so that the "new" parity bits for the matrix 60A become available for writing. The read/write control for this matrix is not shown for the sake of brevity.

Figure 4:
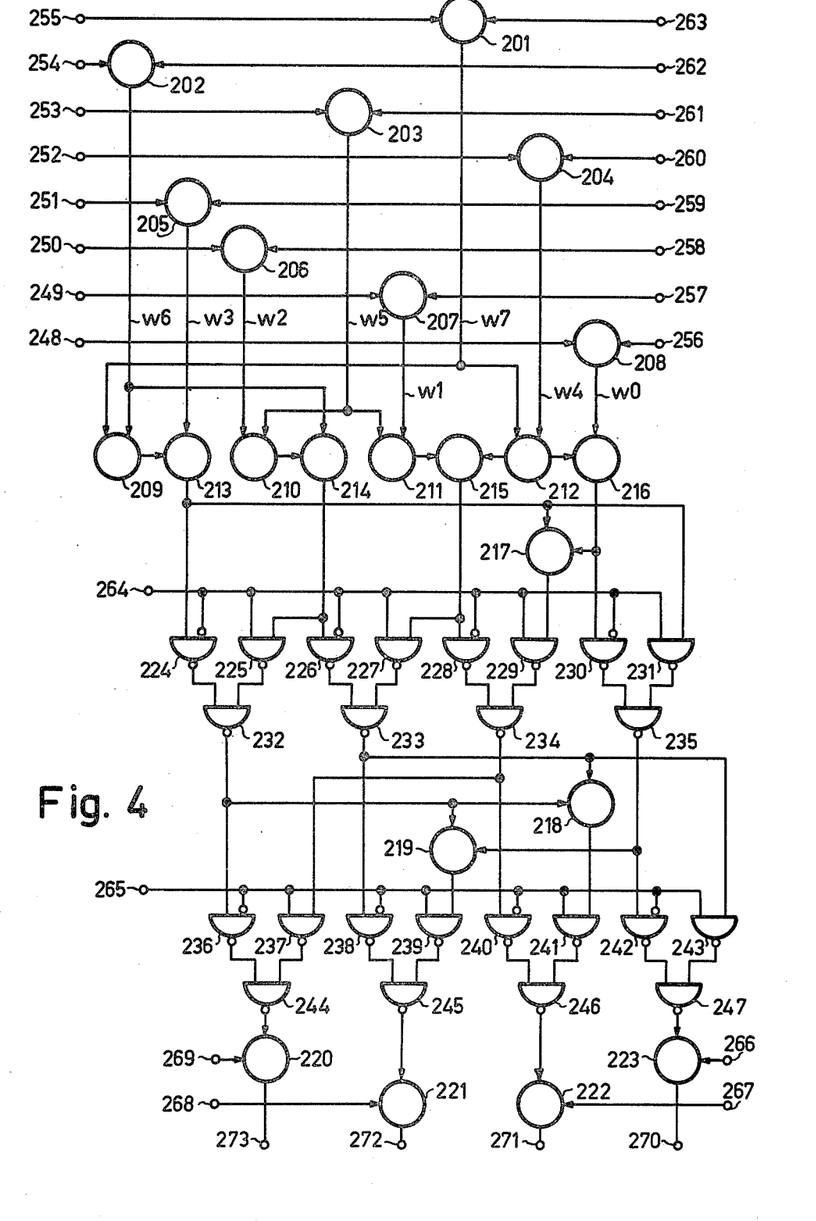
FIG. 4 shows a device for forming a corrector symbol.

FIG. 4 shows an embodiment of a circuit which serves, when a new or modified user word is written in a word location of a memory location, to update the correction data associated with said word location. The circuit is designed for the simpler example of FIG. 3 and contains the elements 97, 95, 98 and 99 thereof. The further elements of the circuits shown in the FIGS. 3–6 for generating the correction/parity bits partly have a conventional construction and partly a construction as shown in FIG. 4. The circuit comprises twenty-three exclusive-OR gates 201–223 and twenty-four NAND-gates 224–247. When a new user word is ready, it is bit-wise applied to the inputs 248–255. The memory words are assumed to be composed as shown in FIG. 1. Together with these words the user word stored thus far is bit-wise applied to the inputs 256–263. Each exclusive-OR gate of the series 201–208 thus receives two bits of corresponding significance. The element 97 is thus formed. When the previously empty memory is initiated, the user word stored is (0 . . . 0). The parity matrix associated with the code is written as:

$$H = \begin{bmatrix} 1 & 1 & 1 & 1 & 1 & 1 & 1 & 1 & 0 & 0 & 0 & 0 & 0 & 0 & 0 & 0 & 0 \\ 0 & 0 & 0 & 0 & 0 & 0 & 0 & 0 & 1 & 1 & 1 & 1 & 1 & 1 & 1 & 1 & 0 \\ g0 & g1 & g2 & g3 & g4 & g5 & g6 & g7 & 0 & g0 & g1 & g2 & g3 & g4 & g5 & g6 & g7 & 0 & 1 \end{bmatrix}$$

Each code (memory) word satisfies: $\vec{c} \cdot [H] = 0$.

For the first two matrix lines, this means that the parity of the user word including the parity bit must be even. For the determination of the condition imposed by the third line of the matrix, it is to be remembered that each element of the Galois field $GF(2^M) = GF(2^4)$ can be written as a linear combination of the first four elements $a^0, a^1, a^2, a^3$ of $GF(2^4)$, or as far as this is concerned, of any four arbitrary elements of $GF(2^4)$, provided these four elements form a linearly independent set. Consequently, for example, the four-bit elements $c(9a+b)$ of the code word $\vec{c}$ may be written as the following sum, j being a variable:

$$c(9a + b) = \sum_{j=0}^{3} c(9a + b, j) \cdot a^j \quad (1)$$

The correction symbol is found if $$c(18) = \sum_{a=0}^{1} \sum_{b=0}^{7} c(9a + b) \cdot g(b) \quad (2)$$

Substitution of (1) in (2) produces:

$$c(18) = \sum_{a=0}^{1} \sum_{b=0}^{7} \sum_{j=0}^{3} a^j \cdot c(9a + b, j) \cdot g(b) =$$

$$\sum_{a=0}^{1} \sum_{j=0}^{3} a^j \sum_{b=0}^{7} c(9a + b, j) \cdot g(b)$$

This means that the corrector bits are formed as the sum of the contributions of the individual user words to the corrector bits. Obviously, this results in a comparatively simple circuit because, when an old user word is replaced by a new user word, only these two sets of bits need be taken into account. The contribution of the user word having the number j of the memory bank having the number a, therefore, is:

$$a^j \sum_{b=0}^{7} c(9a + b, j) g(b)$$

When a new user word is written, it is merely necessary to add the contribution of the difference between old and new user word to the corrector bits already present; this is correct because all relationships are linear. The above summation $$\sum_{b=0}^{7} \{c_{old}(9a + b, j) \oplus c_{new}(9a + b, j)\} g^b$$

is done in the element 95. This is because, when the output signals of the gates 208–201 in FIG. 4 are referred to as w0 . . . w7 in this sequence, the following multiplication is formed therefrom:

$$\begin{pmatrix} v0 \\ v1 \\ v2 \\ v3 \end{pmatrix} = \begin{pmatrix} 1 & 0 & 0 & 0 & 1 & 0 & 0 & 1 \\ 0 & 1 & 0 & 0 & 1 & 1 & 0 & 1 \\ 0 & 0 & 1 & 0 & 0 & 1 & 1 & 0 \\ 0 & 0 & 0 & 1 & 0 & 0 & 1 & 1 \\ a''0 & a''1 & a''2 & a''3 & a''4 & a''5 & a''6 & a''7 \end{pmatrix} \begin{pmatrix} w0 \\ w1 \\ w2 \\ w3 \\ w4 \\ w5 \\ w6 \\ w7 \end{pmatrix}$$

in order to form the four-bit symbol $\underline{v}$. The first eight elements $\neq 0$ in accordance with the left half of FIG. 5 of the Galois field have been used. Therefrom, it follows directly $v0 = w0 \oplus w4 \oplus w7$ $v1 = w1 \oplus w4 \oplus w5 \oplus w7$ $v2 = w2 \oplus w5 \oplus w6$ $v3 = w3 \oplus w6 \oplus w7$ The OR-gates 209–216 in this case form the following functions:
 209: $w6 \oplus w7$
 210: $w5 \oplus w2$
 211: $w1 \oplus w5$
 212: $w4 \oplus w7$
 216: v0; 215: v1; 214: v2; 214: v3.

The module 95 of the circuit shown in FIG. 3 is thus realized by these elements. The symbol $\underline{v}=(v3\ v2\ v1\ v0)$ should subsequently be multiplied by $\underline{a}^j$. The value of j is given in binary form and is not decoded in this example, but each of the two bit positions of the user word number controls one of the two stages constituting the element 98.

When the terminal 264 receives a logic "0", indicating an even user word number, the gates 224, 226, 228, 230 can conduct and the quantity $\underline{v}$ is applied in unmodified form, via the relevant gates 232, 233, 234, 235, to the second stage.

When the terminal 264 receives a logic "1", indicating an odd user word number, the gates 225, 227, 229, 231 can conduct and the quantity $\underline{v}$ is multiplied by the symbol $\underline{a}$:

$$(v3,\ v2,\ v0) \times \underline{a} = (v2,\ v1,\ v0 \oplus v3,\ v3),$$

in which said exclusive-OR function is formed by the gate 217, the results being applied to the next stage via the relevant gates 232, 233, 234, 235.

If the terminals 264 and 265 both receive a logic "0", the gates 236, 238, 240, 242 also conduct (a circle denotes an inverting input/output), the quantity $\underline{v}$ then being applied to the output in unmodified form via the relevant gates 244, 245, 246, 247.

However, if in the latter case the terminal 265 receives a logic "1", indicating the user word number (10), the gates 237, 239, 241 243 conduct and the quantity $\underline{v}$ is multiplied by the symbol $\underline{a}^2$.

$$(v3\ v2\ v1\ v0) \times \underline{a}^2 = (v1,\ v0 \oplus v3,\ v2 \oplus v3,\ v2),$$

in which said exclusive-OR functions are formed by the gates 218, 219, the results being applied to the output via the relevant gates 244, 245, 246, 247.

If the word number is (11), the following is correspondingly formed:

$$(v3\ v2\ v1\ v0) \times a^3 = (v1,\ v0 \oplus v3,\ v2 \oplus v3,\ v2) \times a = (v0 \oplus v3,\ v2 \oplus v3,\ v1 \oplus v2,\ v1).$$

The module 98 of the circuit shown in FIG. 3 is thus realised.

The output signals of the gates 244–247 are bit-wise modulo-2 added to the correction bits which appear on the inputs 266, 267, 268, 269, respectively. The new correction bits appear for restorage on the relevant outputs of the gates 220–223. The module 99 of the circuit shown in FIG. 3 is thus realized. The circuit shown in FIG. 4 can be synchronized by the addition of a clock pulse system, but this is not shown for the sake of brevity.

The various memory parameters will be considered hereinafter. The following definitions are applicable:

X is the number of user bits (non-redundant) in a memory word (in FIG. 1: 32).

Y is the number of bits of a memory word which is stored in a single fault isolation area (one in the foregoing, but higher values may also be considered).

K is the number of user bits (not redundant) in a user word (i.e. eight in FIG. 1).

Z=X/Y is the number of fault isolation areas over which the user bits are distributed.

L is the number of memory blanks.

Q is the number of user bits of a user word stored in a single fault isolation area.

If there are at least as many isolation areas as there are user bits in a user word, all user bits are stored in a separate isolation area each time user word: Q=1 and L=Z/K. If the number of user bits for each user word is at least twice the number of isolation areas, (L=1) and Q=K/Z are chosen for one bank. For technological reasons, in the former case use is sometimes made of Q>1; the number of banks then amounts to $L=Z\cdot Q\cdot K^{-1}$.

The columns of the parity matrix used must all be different with respect to each other. In the case of one memory bank, there are only two rows in the parity matrix. The elements are elements of $GF(2^M)$, so that $2^M$ different possibilities exist. In the case of one memory bank, and if the correction bits are not taken into account in the parity the (maximum) number of columns of the matrix can be $2^M+1$ so 17 in the case of FIG. 1; fifteen user bits, one parity bit and one correction bit are then involved. This is because in this case the column for the correction bits contains elements "0" except for one, so it is definitely different from all other columns. If the correction bits are involved in the parity, the number of columns may at the most be $2^M$ and the maximum number of user bits, therefore, is one lower (i.e. 14 in FIG. 1). This can be written as a formula as follows:

$$K \leq 2^M - 1 \text{ and } K \leq 2^M - 2,$$

respectively. If more bits Q are stored in a single fault isolation area, the following is applicable $$K \leq Q(2^M - 1) \text{ and } K \leq Q(2^M - 2),$$

respectively. This demonstrates that in the case of a larger number of user words for each memory word (M larger), the length of the user words may also be larger. The same is applicable if Q is larger.

What is claimed is:

1. A word-organized memory system having a first memory bank, said memory bank having a first plurality of memory locations each accommodating a memory word of a first uniform length; each memory location having within said first uniform length a second plurality of user word locations each accommodating a user word of a second uniform length; said memory system furthermore comprising:

addressing means having an address input for receiving a user address specifying a memory location and within a memory location a user word location;

a data line for transporting an addressed user word;

each user word location having a uniform number of data bit locations and at least one location for a parity bit for detecting a single-bit-error in the associated user word;

wherein the data bits in corresponding bit positions of the user words within a memory location form a plural-bit user symbol and the parity bits in corresponding bit positions of the user words within a memory location form a plural-bit parity symbol;

each memory location furthermore accommodating a plurality of correction bits equal to said second plurality to form a plural bit corrector symbol;

all said symbols forming elements of the same Galois field;

said memory having a detector device having an input connected to the data line for receiving a user word with an associated parity bit for detecting a single-bit error therein and thereupon generating a detection signal on a detection signal output connected to an input of said addressing means for then addressing the further user word locations of the same memory word inclusive of parity bits and corresponding corrector symbol;

said memory system furthermore comprising a corrector device having an activation signal input connected to said detection signal output and furthermore having:

multiplying means having an input connected to the data line for receiving the read and incorrect memory word and multiplying this memory word by a parity matrix that consists of elements of the same Galois field to generate an error symbol and a product symbol of error symbol and locator symbol;

extractor means having an input connected to an output of said multiplying means for receiving said error symbol and said product symbol for therefrom extracting an error locator quantity;

correcting means having an input connected to the data line, to an output of the multiplying means, and to an output of the extracting means for correcting the incorrect memory word at a bit position located by said error locator quantity for an error amounting to said error symbol; and output means for outputting a corrected user word from said correcting means.

2. A memory as claimed in claim 1, characterized in that said first means are suitable for generating signal representing a parity matrix having, for the K user symbols for each user word, including its parity symbol, a user block in the form of:

$$\begin{bmatrix} 1 & 1 & 1 \ldots & 1 & 1 \\ m0 & m1 & m2 \ldots & m(K-1) & 0 \end{bmatrix}$$

with an additional column $$\begin{bmatrix} x \\ mj \end{bmatrix}$$

for the correction symbols, the element series {m0, M1 ..., m(K−1), 0} consisting, in the case of M user words per memory word, of all mutually different elements of the Galois field GF($2^M$), said column (1, 0) being assigned to the parity symbols and said column (x, mj) deviating from all other columns.

3. A memory as claimed in claim 2, in which mj of the set of symbols 0, $a^0$, $a^1$ ... $a(2^M-1)$ within the Galois field GF($2^M$), written as a power series, has the value $a^0$.

4. A memory as claimed in claim 2, characterized in that said first means are adapted to generate a value x−0.

5. A memory as claimed in claim 2, characterized in that said first means are adapted to generate a value $x = a^P$, said value differing from all elements of the series {m0, m1 ... m(K−1)}.

6. A memory system as claimed in claim 1, wherein said data line has bidirectional transport capability, said memory system furthermore comprising a coding device having an input connected to the data line for upon writing of a new user word in a user word location receiving the modification information of the new user word with regard to the former content of the addressed user word location, and also receiving the correction bits of the memory location containing the addressed user word location for updating the correction bits, and having an output connected to the memory location for restoring the updated correction bits.

7. A memory system as claimed in claim 2, wherein said data line has bidirectional transport capability, said memory system furthermore comprising a coding device having an input connected to the data line for upon writing of a new user word in a user word location receiving both the "new" user word and the "old" user word formerly present at the user word location thus addressed, said coding device comprising a modification determining means for under control of the "old" user word and the "new" user word generating user word modification signals; second multiplying means connected to an output of the modification determining means for multiplying the user word modification signals by a vector [m0, m1 ... m(K−1)] to form a corrector modification intermediate symbol, third multiplying means having an input connected to an output of the second multiplying means and to the address line for receiving the user word number within the memory word location thus addressed and multiplying the corrector modification intermediate symbol by said user word number to form a corrector modification symbol, and second correcting means connected to an output of the third multiplying means and to the memory location thus addressed for receiving the correction bits of the memory location containing the addressed user word location for updating the correction bits by the corrector modification symbol, and having an output connected to the memory location thus addressed for restoring the updated correction bits.

8. A memory system as claimed in claim 2, wherein said data line has bidirectional transport capability, said memory system furthermore comprising a coding device having an input connected to the data line for upon writing of a new user word in a user word location receiving both the "new" user word and the "old" user word formerly present at the user word location thus addressed, said coding device comprising a modification determining means for under control of the "old" user word and the "new" user word generating user word modification signals; second multiplying means connected to an output of the modification determining means for multiplying the user word modification signals by a vector [m0, m1, ... m(k−1), mj] to form a corrector modification intermediate symbol, third multiplying means having an input connected to an output of the second multiplying means and to the address line for receiving the user word number within the memory word location thus addressed and multiplying the corrector modification intermediate symbol by said user word number to form a corrector modification symbol; second correcting means connected to an output of the third multiplying means and to the memory location thus addressed for receiving the correction bits and the parity symbol of the memory location containing the addressed user word location for updating the correction bits by the corrector modification symbol and for updating the parity symbol of the relevant memory word annex corrector symbol also by the corrector modification symbol, said coding device having an output connected to the memory location thus addressed for re-storing the updated correction its and parity symbol.

9. A memory as claimed in claims 1 or 2 further including at least one second memory bank having a first plurality of memory locations each accommodating a memory word of a first uniform length, each memory location having within said first uniform length a second plurality of user word locations, each of which accommodating a user word of a second uniform length; for each second memory bank a memory word forming a code word with a corresponding memory word from the first memory bank; the correction symbol of the memory word from the first memory bank contained therein having a correcting symbol for each code word.

10. A memory as claimed in claim 9, characterized in that said first means are adapted to generate signals representing a parity matrix including as many (L) user blocks as there are memory banks, the user blocks containing (L−1) rows of elements 0, furthermore all containing a single row, differently situated in each block, containing exclusively elements 1, and one correspondingly situated additional row consisting of a series of all mutually different elements of the Galois field $GF(2^M)$, said additional column containing, at the position corresponding to said additional row, a further element of the Galois field $GF(2^M)$ and containing for the remainder, in addition to at the most one element having the value $a^0$ within $GF(2^M)$, exclusively elements 0.

11. A memory as claimed in claim 10, characterized in that said first means are adapted to generate signals representing said further row of the parity matrix for each user block as a mutually identical row.

* * * * *